United States Patent [19]

Sud et al.

[11] 4,336,466

[45] Jun. 22, 1982

[54] SUBSTRATE BIAS GENERATOR

[75] Inventors: Rahul Sud, Colorado Springs; Kim C. Hardee, Manitou Springs, both of Colo.

[73] Assignee: Inmos Corporation, Colorado Springs, Colo.

[21] Appl. No.: 164,284

[22] Filed: Jun. 30, 1980

[51] Int. Cl.$^3$ ........................ H03L 1/00; H03K 3/354; H03K 3/017

[52] U.S. Cl. ........................................ 307/297; 307/304

[58] Field of Search ..................... 307/200 B, 297, 304, 307/578, 296 R; 331/108 C, 111, 117 FE, 57

[56] References Cited

U.S. PATENT DOCUMENTS

| | | | |
|---|---|---|---|
| 4,142,114 | 2/1979 | Green | 307/200 B X |
| 4,208,595 | 6/1980 | Gladstein et al. | 307/297 |
| 4,229,667 | 10/1980 | Heimbigner et al. | 307/297 |

FOREIGN PATENT DOCUMENTS

| | | | |
|---|---|---|---|
| 2812378 | 9/1979 | Fed. Rep. of Germany | 307/304 |
| 55-68667 | 5/1980 | Japan | 307/304 |

OTHER PUBLICATIONS

Blaser et al., "Substrate and Load Gate Voltage Compensation"; Session VI: MOS Techniques; 1976 IEEE-ISSCC; 2/18/76; Digest of Technical Papers pp. 56–57.

Gladstein et al., "FET Substrate Generator Derived from Low Voltage Power Supply"; *IBM Tech. Discl. Bull.*; vol. 21, No. 12, pp. 4935–4936; 5/1979.

*Primary Examiner*—Larry N. Anagnos

*Attorney, Agent, or Firm*—Cook, Wetzel & Egan, Ltd.

[57] ABSTRACT

A substrate bias generator for an integrated circuit, metal-oxide-semiconductor (MOS) random access memory (RAM) is described. The on-chip generator includes two input terminals for receiving first and second trains of periodic pulses. The periodic pulses have the same frequency and are phase synchronized. However, the first train of pulses has a greater duty cycle than the second train of pulses. Amplitude transitions associated with the first and second trains of pulses are capacitively coupled to first and second nodes, respectively. A pair of transistors are coupled to the nodes, one transistor for clamping the first node to ground when the second node receives a positive-going voltage transition, and another transistor for selectively coupling amplitude transitions from the first node to the second node. In operation, both nodes are driven more negative with each successive incoming pulse until they reach about −5 volts for the case in which the amplitude of the incoming pulses is 5 volts. A third transistor closes a current path between the first node and the chip's substrate when the substrate voltage is at least one threshold voltage more positive than the first node voltage. As a result, the substrate voltage is driven to a negative level which is about one threshold voltage more positive than the furthest negative voltage level on the first node.

9 Claims, 4 Drawing Figures

10
OSCILLATOR
11
DRIVER
12
13
14
15
16
Vbb

17
OSCILLATOR AND TIMING CIRCUITRY
18
DRIVER
19
DRIVER
20
21
A
B
22
23
24
25
26
27
28
29
30
C
D
E
16
Vbb

SUBSTRATE BIAS GENERATOR

BACKGROUND OF THE INVENTION

The invention relates to the field of metal-oxide-semiconductor memory devices and, more particularly, to an improved substrate bias generator for random access memories.

A negative bias voltage is typically applied by a back bias generator to the substrate of a metal-oxide-semiconductor (MOS) random access memory (RAM) in order to improve the performance of the MOS circuit. The applied negative voltage, generally about minus 3.5 volts with respect to ground, lowers the junction capacitance between N+ doped silicon layers and the P− doped silicon substrate. As a result, the MOS circuit operates at a faster speed.

In addition to attaining faster circuitry speed, the application of back bias voltage to the substrate reduces the sensitivity of the threshold voltage in the memory chip to variations in the potential between the source of an MOS transistor and the substrate bias.

In previous generations of memory devices, the back bias voltage was developed externally to the memory chip. More recently, back bias voltages have been generated on the chips themselves by using a charge pump to develop a negative back bias voltage. However, the charge pumps are limited to pulling the substrate potential down to a voltage in the range of minus 2.5 to minus 3.5 volts due to threshold voltage drops associated with the pump.

OBJECTS OF THE INVENTION

A general object of the invention is to provide an improved, on-chip, back bias generator.

A more specific object of the invention is to provide an on-chip back bias generator for developing a well controlled, more negative voltage than previously obtainable so as to attain faster circuit speed and further minimize threshold voltage variations in the memory chip due to variations in the potential between the source of an MOS transistor and the substrate bias, as well as reduce the possibility of charge injection in case of substrate bounce.

Another object of the invention is to provide an on-chip back bias generator which utilizes very little power.

A further object of the invention is to provide an on-chip back bias generator which attains a faster pump down for a given frequency by achieving greater charge transfer per cycle.

An additional object of the invention is to provide an on-chip back bias generator in which the substrate bias is less dependent on the threshold voltage.

Other objects will become apparent in the detailed description of the invention.

SUMMARY OF THE INVENTION

The present invention provides an improved on-chip substrate bias generator which develops a more negative substrate voltage than heretofore available by eliminating a threshold voltage drop normally associated with conventional substrate bias generators. In a preferred embodiment, the substrate bias generator includes first and second input terminals for receiving first and second trains of periodic pulses, respectively. The first periodic pulses and the second periodic pulses have the same frequency and are phase synchronized. However, the first periodic pulses have a duty cycle which is greater than the second periodic pulses.

Included in the generator is a first node capacitively coupled to the first input terminal and a second node capacitively coupled to the second input terminal. Thus, the first node receives positive and negative voltage transitions associated with the first train of pulses and the second node receives positive and negative voltage transitions associated with the second train of pulses.

To convert the received voltage transitions to a low negative voltage at the first node for application to the substrate, a gating transistor is coupled between a reference voltage (ground) and the first node, and is gated on by the voltage at the second node when the latter voltage is driven positive by an amplitude transition derived from the second train of pulses. Thus, when a later negative-going amplitude transition is received at the first node, that node is driven further negative.

Another transistor is coupled between the first and second nodes and is biased by the reference voltage so as to couple to the second node the voltage transitions received at the first node when both nodes are sufficiently negative to turn the latter transistor on. With this arrangement, both nodes are incrementally driven more negative until they reach about −5 volts in the case where the amplitude of the incoming pulses is 5 volts.

A third transistor couples the first node to the substrate so as to pump current between the substrate and the first node when the substrate voltage is more positive than the voltage at the second node. Thus, a substrate voltage is developed which is about one threshold voltage more positive than −5 volts.

DETAILED DESCRIPTION OF THE INVENTION

Figures 1, 2:
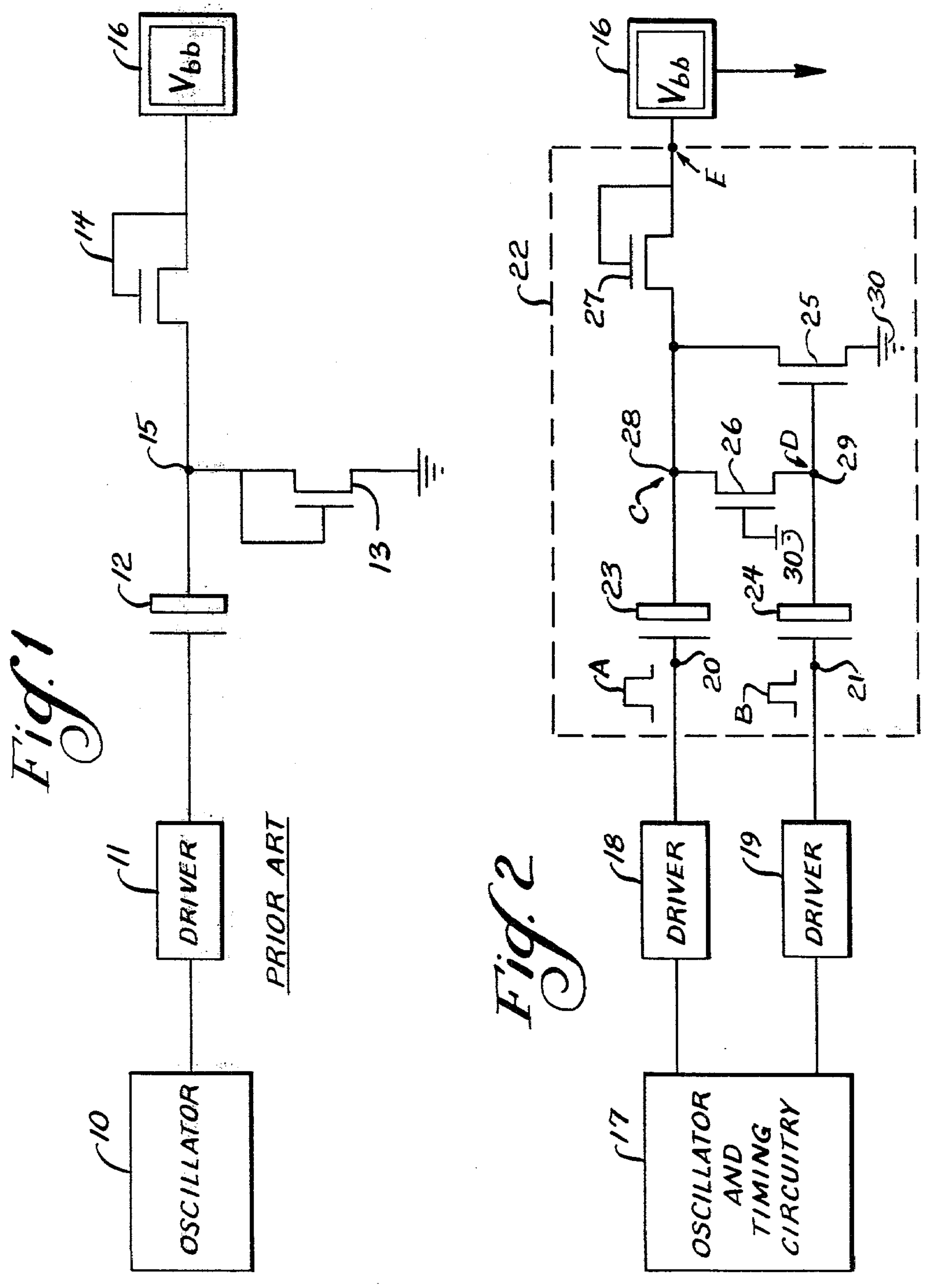
Fig. 1 PRIOR ART
FIG. 1 illustrates a prior art generator with a single input signal.
FIG. 2 illustrates a preferred embodiment of a substrate bias generator according to the invention, shown in combination with an oscillator and clock drivers, for developing a substantially constant negative bias voltage.

Referring briefly to FIG. 1, a prior art circuit used to bias the substrate of MOS integrated circuits is shown. The illustrated circuit includes an oscillator 10, driver 11, capacitor 12, and enhancement mode transistors 13 and 14. In operation, a periodic pulse generated by the oscillator 10 and driver 11 is coupled to a junction or node 15 between transistors 13 and 14 by the capacitor 12. The transistor 13 is turned on to clamp the potential on node 15 toward ground potential during the positive amplitude transition of the periodic pulse and is then turned off, thereby enabling the potential on node 15 to be driven negative, during the negative amplitude transition of the periodic pulse. This, in turn, permits current to flow through transistor 14 from the substrate 16 to node 15 so as to drive the potential of the substrate 16 to a negative level.

One problem with the illustrated circuit is that the potential on node 15 cannot be completely clamped to ground potential during positive amplitude transitions because of the threshold voltage lost across transistor 13. This prevents the substrate voltage from reaching a further negative value during the negative amplitude transitions.

In contrast to the circuit of FIG. 1, the preferred embodiment of the invention utilizes the on-chip circuit of FIG. 2 to reach and substantially maintain a more negative substrate voltage. This circuit includes an oscillator and timing circuitry 17 connected to drivers 18 and 19 for producing a first train of periodic pulses to an input terminal 20 and a second train of periodic pulses at an input terminal 21, respectively. The waveforms generated at input terminals 20 and 21 have the same frequency, approximately five megahertz in the preferred embodiment, are phase synchronized, and have amplitudes of about 5 volts. However, the waveform produced at input terminal 20 by the first train of periodic pulses has a greater duty cycle than the waveform produced at input terminal 21 by the second train of periodic pulses. Consequently, the waveforms overlap in such a manner that the waveform at input terminal 21 is enclosed within the waveform at input terminal 20.

Figure 4:
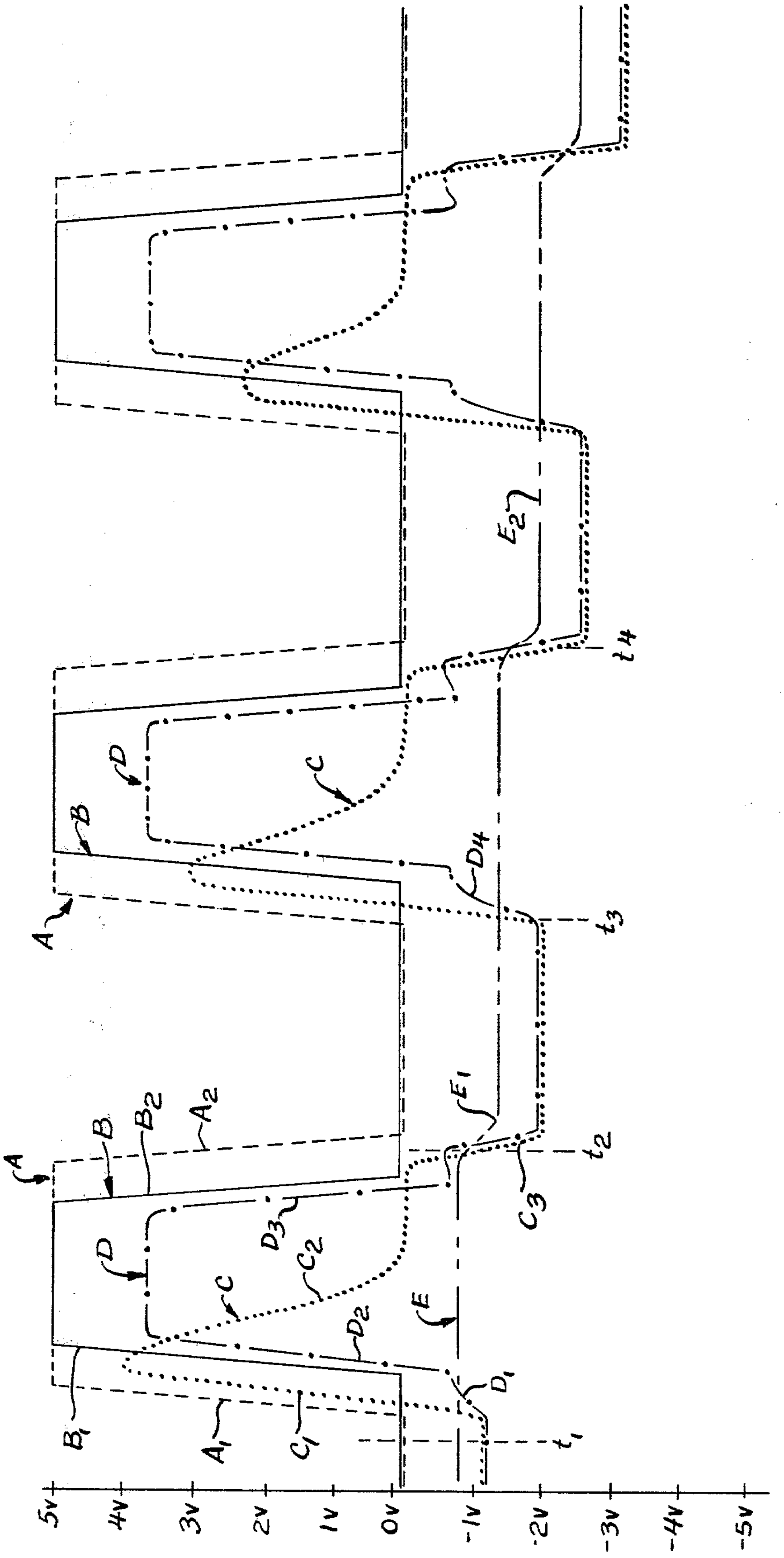
FIG. 4 illustrates various waveforms to facilitate the description of the operation of the substrate bias generator.

Referring briefly to FIG. 4, the waveform appearing at the input terminal 20 is shown as waveform A and the waveform appearing at the input terminal 21 is shown as waveform B. The illustrated overlap between waveforms A and B assures that there is a sufficient time period, ten nanoseconds, for example, between the rise in voltage potential at the input terminal 21, as well as a sufficient time period between the fall in voltage potential at input terminal 21 and the fall in voltage potential at input terminal 20. The purpose of these two time periods will become apparent from the discussion below concerning the operation of the substrate bias generator.

Referring back to FIG. 2, a generator or pump 22 is derived by capacitors 23 and 24 and transistors 25–27. Node 28 is coupled via capacitor 23 to input terminal 20 so as to receive positive and negative voltage transitions derived from positive and negative amplitude transitions in the first train of periodic pulses at input terminal 20. Similarly, node 29 is coupled via capacitor 24 to input terminal 21 so as to receive positive and negative voltage transitions derived from positive and negative amplitude transitions in the second train of periodic pulses at input terminal 21. As shown in FIG. 4, the amplitude transitions of the periodic pulses at input terminals 20 and 21, illustrated by waveforms A and B, drive the potentials at nodes 28 and 29, illustrated by waveforms C and D, positive and negative. As described below, the potentials at nodes 28 and 29 are employed to develop a negative bias voltage on the substrate 16, as illustrated by waveform E.

Enhancement mode transistor 25 is connected between node or junction 28 and a reference voltage which may be circuit ground 30. Node 29 is coupled to the gate of transistor 25 for clamping node 28 to ground during the on time of each pulse in the second train of periodic pulses at input terminal 21. When the potential at node 29 falls to within the threshold voltage of transistor 25, transistor 25 turns off and thereby releases the clamp on node 28.

Enhancement mode transistor 26 is connected between nodes 28 and 29 with its gate biased to ground for coupling the potential of node 29 toward the potential of node 28. Coupling occurs only when the potential on both nodes 28 and 29 are negative and the potential on node 29 is at least a threshold voltage below the potential of the grounded gate of transistor 26.

Enhancement mode transistor 27 is connected between node or junction 28 and substrate 16 for activation whenever the potential of node 28 is more than the threshold voltage of transistor 27 below the potential of substrate 16. When transistor 27 is turned on, current flows between the substrate 16 and node 28 so that the potential on substrate 16 is within one threshold voltage of the negative potential on node 28. Over a period of time, the negative potential on node 28 is incremently coupled down to a negative voltage limit which is directly proportional to the amplitude transitions at the input terminals. Consequently, the potential on substrate 16 is incremently biased to a lower negative potential until the substrate 16 reaches a negative voltage which is offset above the negative voltage at node 28 only by the threshold voltage of transistor 27. Thereafter, this negative voltage on substrate 16 is substantially maintained. Any change in substrate voltage due to leakage is compensated for during the following pumping cycle which is described in detail below.

Referring to FIGS. 2 and 4, the waveforms C and D indicate that nodes 28 and 29 are both negative at an arbitrary time $t_1$ (see the left-hand portion of FIG. 4). The potential E on the substrate 16 is also negative. In addition, transistors 25 and 27 are turned off while transistor 26 is turned on. As the edge $A_1$ of waveform A begins to rise, the capacitor 23 couples to the node 28 a similar positive-going amplitude transition C1. Also, the potential at node 29 rises as indicated at D1 because of the on condition of transistor 26 which couples node 29 to node 28. This increase in potential at nodes 28 and 29 caused by the waveform A turns transistor 26 off and uncouples node 29 from node 28. Thereafter, the edge B1 of waveform B rises, and the coupling effect of the capacitor 24 causes a positive-going transition D2 to appear at node 29.

As mentioned above, the potential on node 29 is received by the gate of transistor 25. Therefore, when the potential on node 29 rises to a positive voltage which is more than the threshold voltage of transistor 25 above ground, transistor 25 is turned on. The activation of transistor 25 clamps or drives the potential on node 28 (which has by now risen to a 4 volt potential) down to ground potential as indicated at C2.

The potentials at nodes 28 and 29 then remain at their respective voltages until waveform B undergoes a negative transition B2. When the latter transition occurs, the potential on node 29 falls as indicated at D3 to a level just above $-1$ volt, thereby turning the transistor 25 off and releasing the clamp to ground on node 28.

At time $t_2$, waveform A undergoes a negative transition A2 which causes node 28 to be driven negative as shown at C3 due to the coupling effect of the capacitor 23. In addition, the transistor 26 now turns on to couple the negative transition on node 28 to node 29 so as to drive the potential at node 29 further negative to about $-2$ volts.

As a result of the effects described above, the potential on node 28 is now more than a threshold voltage below the potential on substrate 16, whereupon transistor 27 is turned on to permit current to flow between the substrate 16 and node 28, thereby driving the potential E on substrate 16 further negative, as at E1.

At this juncture, the potentials on nodes 28 and 29 are both negative and of approximately equal value due to the coupling effect of the transistor 26 which is on. The transistor 25 is, of course, off during this time.

The potentials on nodes 28 and 29 remain constant until the waveform A produces another positive-going transition at time $t_3$, at which time the previously discussed cycle is repeated except for certain variations as shown in FIG. 4. The potential on node 28 (waveform C) now starts at a lower voltage (−2 volts) than it started at on the previous cycle, and rises only to approximately the +3 volt level in the second cycle of operation. However, the potential at node 29 (waveform D) still rises to its previous level near +4 volts. The reason for this is that the potentials of nodes 28 and 29 start at a more negative potential than they did at the beginning of the previous cycle, and thus have further to rise before turning off the transistor 26. Thus, the transistor 26 again couples the node 29 to the node 28 for a long enough time to permit the potential at node 29 to be driven positive as indicated at D4. In fact, the node 29 is driven even more positive by the transition D4 than the previous positive transition D1. Moreover, because waveform A does not drive node 28 as positive during the second cycle (time $t_3$), the node 29 is driven more negative at time $t_4$ by the subsequent negative-going transition of waveform A. Consequently, the potential on the substrate 16 is also driven further negative as shown at E2.

An increased negative voltage at node 28 and at the substrate 16 is attained on each subsequent cycle until the potential on node 28 reaches approximately −5 volts. Thereafter, the potential on substrate 16 is substantially maintained to within a threshold voltage of the −5 volt level on node 28.

Figure 3:
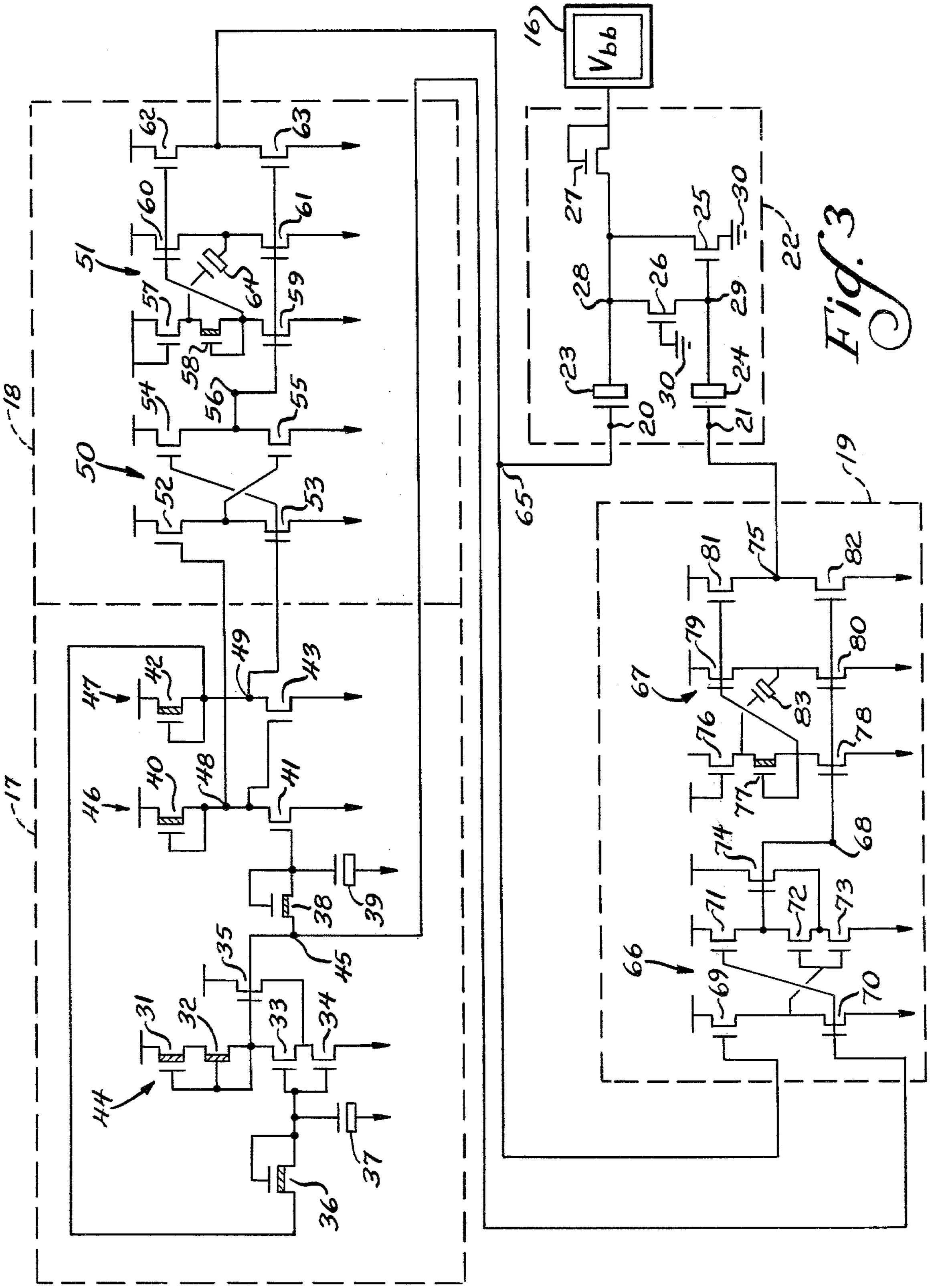
FIG. 3 shows the substrate bias generator of FIG. 2 and circuit details of the oscillator and clock drivers.

Circuit details of the oscillator 17 and drivers 18 and 19 are shown in FIG. 3. Oscillator 17 is a self-starting, three-stage oscillator which includes MOS devices 31–43. A Schmidt-type trigger stage 44 formed by depletion mode transistors 31 and 32 and enhancement mode transistors 33–35 acts as an inverter when a certain voltage is reached. The Schmidt stage 44 is used in the preferred embodiment because it requires less stages and, therefore, less power for a given frequency than a conventional ring oscillator. As a result, cleaner waveforms are provided to the drivers 18 and 19. The output of the Schmidt stage 44 at node 45 is delivered to the remaining oscillator stages and to driver 19.

An RC delay path is formed by depletion mode transistor 36 and capacitor 37 at the input to the Schmidt stage 44. Similarly, another RC delay path is formed by depletion mode transistor 38 and capacitor 39 at the output to the Schmidt stage 44. These delay paths set the pulse width of oscillator 17 which, in turn, determines the frequency. Transistor 38 and capacitor 39 are coupled to a pair of inverters 46 and 47. Inverter 46, formed by depletion mode transistor 40 and enhancement mode transistor 41, drives inverter 47 which is defined by depletion mode transistor 42 and enhancement mode transistor 43. Inverter 46 also provides a first input to driver 18 at node 48. Inverter 47 provides a feedback loop to oscillator 17 and a second input to driver 18 at node 49.

Driver 18, including timing circuitry 50 and a bootstrap clock driver circuitry 51, produces a first train of periodic pulses which is delivered to input terminal 20 for creating potential transitions in the substrate bias generator 22. The same train of periodic pulses also acts as an input to driver 19. Timing circuitry 50, defined by enhancement mode transistors 52–55, is arranged as a pair of push-pull enhancement drivers for producing alternating high and low input signals at node 56 for introduction into bootstrap clock driver circuitry 51. Bootstrap driver 51, defined by transistors 57–63 and capacitor 64, is discussed in detail in a related U.S. patent application, Ser. No. 172,766, filed July 28, 1980. Bootstrap driver 51 basically inverts its input signal at node 56 from high to low and vice versa to provide a first train of periodic pulses at node 65 for delivery to input terminal 20 and driver 19.

Driver 19 includes timing circuitry 66 and bootstrap clock driver 67 and produces a second train of periodic pulses at node 68 for delivery to input terminal 21. Timing circuitry 66, defined by enhancement mode transistors 69–74, produces alternating high and low input signals at node 68 for delivery to bootstrap driver 67. Timing circuitry 66 has a somewhat slower pulling down delay due to the Schmidt action created by in series transistors 72 and 73. Bootstrap driver 67, which is formed by associated transistors 76–82 and capacitor 83, performs similarly to bootstrap driver 51 to produce a second train of periodic pulses at node 75. The pulses at node 65 have a greater duty cycle than the pulses at node 68 due to the differences created by timing circuitries 50 and 66.

At an arbitrary time when nodes 28 and 29 both have negative potentials (as at $T_1$ in FIG. 4), oscillator 17 produces a high at node 45, a low at node 48, and a high at node 49. Node 45 being high insures that node 68 will be high and that node 75 will be co-responding low thereby providing a zero voltage at input terminal 21. As a result, node 29 maintains its negative potential.

The condition of node 48 being low and node 49 being high causes node 56 to be high. Correspondingly, bootstrap driver 51 produces a low at node 65 for delivery to input terminal 20 and timing circuitry 66. Node 28 remains at its same negative potential. Since node 28 is not more than the threshold voltage of transistor 27 (approximately 0.6 volts) below the substrate potential, transistor 27 is off.

At a later point in time, oscillator 17 produces a low at node 45 which turns transistors 70 and 71 off. After a slight time delay, node 48 goes high and turns transistor 52 on. Correspondingly, transistor 54 is turned on and thereby discharges node 56 to ground. This permits driver 18 to bootstrap node 65 high. Capacitor 23 couples this positive-going transition to node 28. Since node 29 is more than the threshold voltage of transistor 26 below ground, transistor 26 is on. Hence, the potential at node 29 begins to rise as described above.

Node 65 going high turns transistor 69 on. Transistor 69 is sized to give approximately the right delay time between node 65 going high and node 75 going high. Transistor 69 then causes the Schmidt trigger-type stage constituted by transistors 71–74 to discharge node 68 to ground after a certain time delay, thereby, turning off transistors 78, 80, and 82 of bootstrap driver 67 and allowing node 75 to rise. Capacitor 24 couples this positive-going transition to node 29 and transistor 25 turns on to clamp node 28 to ground.

The status quo is maintained until node 75 begins to fall. This occurs in the following manner. After node 48 goes high, inverter 47, as defined by transistors 42 and 43, forces node 49 low. The low at node 49 is then coupled back around the feedback loop of oscillator 17 as an input to transistor 36 and the Schmidt stage 44. As a result, the gates of transistors 33 and 34 are driven low and node 45 goes high to turn on transistor 70 of timing circuitry 66. Accordingly, transistors 72 and 73 turn off and transistor 71 turns on, allowing node 68 to go high. A high at node 68 subsequently turns transistors 78, 80, and 82 on. This activity disables driver 19 thereby permitting node 75 to fall. As the potential on node 75 falls, that negative-going transition is coupled to node 29 by capacitor 24.

Referring back to node 45, the high there is fed through the RC delay path of transistors 38 and 39 to inverter 46 as defined by transistors 40 and 41, resulting in a low at node 48. This low propagates through inverter 47 thereby pushing node 49 high. Thereafter, the high on node 49 propagates through source follower transistor 54, allowing node 56 to go high. Accordingly, the high at node 56 turns on transistors 59, 61, and 63, thereby disabling boostrap driver 18 and allowing node 65 to fall. The delay time between node 75 falling and node 65 falling is determined by the propagation delay between the RC time constant as determined by transistors 38 and 39 and inverters 46 and 47.

When node 65 falls, this negative-going transition is coupled to node 28, and transistor 26 turns on, dragging node 29 toward the potential of node 28. The driving of node 29 further negative turns off clamp transistor 25 as explained above. Once node 28 falls more than the threshold voltage of transistor 27 below the substrate voltage, transistor 27 turns on, thereby driving the substrate voltage further negative.

Referring back to FIG. 4, once the substrate bias generator is permitted to operate for another cycle, the substrate potential is driven further negative. This activity of driving the substrate voltage further negative continues until node 28 cannot be driven any further negative. At this point, the substrate voltage is within transistor 27's threshold voltage of the maximum negative voltage attainable at node 28 (approximately −5 volts). During subsequent cycles, as node 28 fluctuates between a negative 5 volts and ground potential, there is leakage at the biased substrate permitting its potential to slightly increase. However, as node 28 is driven negative on the next cycle, the substrate potential returns to within a threshold voltage of node 28, i.e., approximately −4.5 volts. Therefore, the substrate bias generator substantially maintains the substrate potential within transistor 27's threshold voltage of the most negative potential reached at node 28.

In the above description, specific details of an embodiment of the invention have been provided for a thorough understanding of the inventive concepts. It will be understood by those skilled in the art that many of these details may be varied without departing from the spirit and scope of the invention.

What is claimed is:

1. A bias generator for the substrate of a metal-oxide-semiconductor integrated circuit which includes a circuit reference voltage and transistors each having an inherent threshold voltage conduction point, said generator comprising:

means for generating first and second trains of period pulses such that said first periodic pulses and said second periodic pulses have the same frequency and are phase synchronized, and such that said first periodic pulses are first occurring and have a duty cycle greater than that of said second periodic pulses;

a first input terminal for receiving the train of first periodic pulses;

a second input terminal for receiving the train of second periodic pulses;

a first node capacitively coupled to said first terminal for receiving positive and negative voltage transitions derived from positive and negative amplitude transitions associated with said first pulses;

a second node capacitively coupled to said second terminal for receiving positive and negative voltage transitions derived from positive and negative amplitude transitions associated with said second pulses;

a first transistor coupled to said first and second nodes and biased by the reference voltage so as to couple voltage transitions between said first and second nodes;

a second transistor coupled between the reference voltage and said first node and controlled by the voltage on said second node for clamping said first node to the reference voltage in response to voltage transitions which drive the potential of said second node a threshold voltage more positive than the reference voltage; and means for driving the substrate voltage to a voltage level slightly more positive than the voltage at said first node.

2. A bias generator as set forth in claim 1 wherein said means for driving the substrate voltage includes an enhancement mode transistor coupled between said first node and the substrate so as to conduct only when the substrate voltage is one threshold voltage more positive than the voltage at said first node.

3. A bias generator as set forth in claim 1 wherein said first transistor includes gate, source and drain terminals, the gate terminal being coupled to the reference voltage, the drain terminal being coupled to said first node, and the source terminal being coupled to said second node.

4. A bias generator as set forth in claim 1 wherein said second transistor includes a gate terminal, a drain terminal, and a source terminal, the gate terminal being connected to said second node, the drain terminal being connected to said first node, and the source terminal being connected to the reference voltage.

5. A substrate bias generator which includes a circuit for developing an on-chip negative voltage for application to the substrate of a metal-oxide-semiconductor integrated circuit comprising:

generating means for generating first periodic pulses at a first input terminal and second periodic pulses at a second input terminal, said pulses being phase synchronized and having the same frequency, said first pulses having greater duty cycles than said second pulses;

a first node connected by a first capacitance means to said first input terminal, said first capacitance means coupling the amplitude transitions associated with said first pulses to said first node;

a second node connected by a second capacitance means to said second input terminal, said second capacitance means coupling the amplitude transitions associated with said second pulses to said second node;

a first transistor means connected to said first node and said second node and biased to ground so as to drive the voltage at said second node positive during a positive transition at said first node and negative during a negative transition at said first node when said first and second nodes are negative with respect to ground;

a second transistor means coupled between said first node and the ground circuit and being responsive to the voltage at said second node for clamping said first node to ground when the second node voltage is more than a threshold voltage above ground;

a third transistor means between said first node and the substrate for conducting current between said substrate and said first node when the voltage of said first node is negative with respect to the substrate voltage;

whereby the substrate voltage is periodically pumped toward a negative potential developed on said first node.

6. A substrate bias generator which includes a circuit for developing a negative voltage for application to the substrate of a metal-oxide-semiconductor integrated circuit comprising:

oscillator means;

a first driver means responsive to the output from said oscillator for generating a first train of pulses of a first frequency and of a first duty cycle;

a second driver means responsive to the output from said oscillator and said first pulse train for generating a second train of pulses of said first frequency and of a second duty cycle, the pulses of said first and second pulse trains being phase synchronized and said second duty cycle being shorter than said first duty cycle;

a first node connected by a first capacitor to said first driver means, said first capacitor coupling amplitude transitions associated with pulses in said first train to said first node;

a second node connected by a second capacitor to said second driver means, said second capacitor coupling amplitude transitions associated with pulses in said second train to said second node;

a first enhancement mode transistor coupled between said first node and ground, said first enhancement mode transistor being responsive to amplitude transitions at the second node effected by said second pulse for clamping the first node to ground;

a second enhancement mode transistor coupled between said first and second nodes, the gate of said second enhancement mode transistor being connected to ground, said second transistor coupling amplitude transitions received by said first node to said second node;

a third enhancement mode transistor between said first node and the substrate responsive to the voltage of said first node for establishing a current flow between said substrate and said first node, whereby the potential of the substrate is substantially maintained a threshold voltage above the lowest negative potential reached by said first node.

7. The substrate bias generator of claim 6 wherein said first enhancement mode transistor clamps the first node to ground when the second node has a potential more than a threshold voltage of said first enhancement mode transistor above ground.

8. The substrate bias generator of claim 6 wherein said second enhancement mode transistor couples said second node to said first node when both first and second nodes have negative potentials and said second node has a potential more than a threshold voltage of said second enhancement mode transistor below ground.

9. The substrate bias generator of claim 6 wherein said third enhancement mode transistor has its gate biased to the substrate, said enhancement mode transistor permitting current to flow therethrough when said first node has a potential more than a threshold voltage of said third enhancement mode transistor below the substrate potential.

* * * * *